United States Patent
Babitch et al.

(10) Patent No.: US 9,151,845 B2
(45) Date of Patent: Oct. 6, 2015

(54) REVERSE FREQUENCY AND TIME AIDING

(75) Inventors: Daniel Babitch, San Jose, CA (US);
Steven A. Gronemeyer, Cedar Rapids, IA (US)

(73) Assignee: Cambridge Silicon Radio Limited, Cambridge (GB)

( * ) Notice: Subject to any disclaimer, the term of this patent is extended or adjusted under 35 U.S.C. 154(b) by 837 days.

(21) Appl. No.: 13/344,036

(22) Filed: Jan. 5, 2012

(65) Prior Publication Data
US 2013/0176170 A1    Jul. 11, 2013

(51) Int. Cl.
*G01S 19/26* (2010.01)
*G01S 19/23* (2010.01)
*H03J 3/04* (2006.01)
*H03L 1/02* (2006.01)

(52) U.S. Cl.
CPC ............... *G01S 19/26* (2013.01); *G01S 19/235* (2013.01); *H03J 3/04* (2013.01); *H03L 1/022* (2013.01)

(58) Field of Classification Search
USPC ........................................ 342/357.65, 357.62
IPC ......... G01S 19/26,19/235; H03J 3/04, 2200/11, H03J 2200/12, 2200/13; H03L 1/022
See application file for complete search history.

(56) References Cited

U.S. PATENT DOCUMENTS

| | | | |
|---|---|---|---|
| 5,654,718 A * | 8/1997 | Beason et al. | 342/357.62 |
| 5,841,396 A * | 11/1998 | Krasner | 342/357.75 |
| 5,893,044 A * | 4/1999 | King et al. | 701/478 |
| 6,246,376 B1 * | 6/2001 | Bork et al. | 343/760 |
| 6,373,430 B1 * | 4/2002 | Beason et al. | 342/357.34 |
| 7,466,209 B2 | 12/2008 | Babitch | |
| 7,855,608 B2 | 12/2010 | Babitch | |
| 2003/0068977 A1* | 4/2003 | King | 455/12.1 |
| 2005/0162306 A1* | 7/2005 | Babitch et al. | 342/357.05 |
| 2005/0195105 A1* | 9/2005 | McBurney et al. | 342/357.1 |
| 2006/0122805 A1* | 6/2006 | Coulson et al. | 702/130 |
| 2009/0054075 A1* | 2/2009 | Boejer et al. | 455/456.1 |
| 2009/0217286 A1* | 8/2009 | Schmidbauer et al. | 718/105 |
| 2010/0069085 A1* | 3/2010 | Hammes et al. | 455/456.1 |
| 2010/0248678 A1 | 9/2010 | Babitch et al. | |
| 2010/0250129 A1* | 9/2010 | Babitch et al. | 701/213 |
| 2011/0068973 A1* | 3/2011 | Humphreys et al. | 342/357.3 |
| 2011/0102257 A1* | 5/2011 | Spyropoulos et al. | 342/357.31 |

* cited by examiner

*Primary Examiner* — Tashiana Adams
*Assistant Examiner* — Fred H Mull
(74) *Attorney, Agent, or Firm* — RatnerPrestia

(57) ABSTRACT

The present system relates to a GNSS receiver that includes a processor. The processor is configured to receive a temperature signal from a temperature sensor indicating an operating temperature of an resonator. The processor is also configured to compute a frequency and a frequency correction data of the resonator based on the temperature and a frequency model of the resonator. The processor then transmits the frequency correction data to an RF receiver which utilizes the frequency correction data and the resonator to receive and RF signal.

19 Claims, 3 Drawing Sheets

REVERSE FREQUENCY AND TIME AIDING

This application relates, in general, to a method and a system where a resonator is shared between a global navigation satellite system (GNSS) receiver and a radio frequency (RF) receiver. More specifically, the system performs reverse frequency and time aiding from the GNSS receiver to the RF receiver.

BACKGROUND OF THE INVENTION

Conventional mobile devices (e.g., a mobile phone) may include a GNSS receiver and an RF receiver (e.g., a cellular modem). In general, the mobile phone may include a voltage controlled temperature compensated crystal oscillator (VCTCXO) that is used by the cellular modem to receive cellular signals and temperature compensated crystal oscillator (TCXO) that is utilized by the GNSS receiver to receive satellite signals. These conventional systems, generally suffer, from an increase in cost and size due to having two separate expensive temperature compensated oscillators for the GNSS receiver and cellular modem.

SUMMARY OF THE INVENTION

To meet this and other needs, an in view of its purposes, the present invention provides a system that includes a global navigation satellite system (GNSS) receiver including a processor. The processor receives a temperature signal from a temperature sensor that indicates an operating temperature of a resonator, and then computes a frequency and a frequency correction data of the resonator based on the temperature signal and a frequency model of the resonator. The processor then transmits the frequency correction data to a radio frequency (RF) receiver. The RF receiver uses the frequency correction data and the resonator to receive an RF signal. It is understood that the forgoing general description and the following detailed description are exemplary, but not restrictive, of the invention.

DETAILED DESCRIPTION OF THE INVENTION

Figure 1:
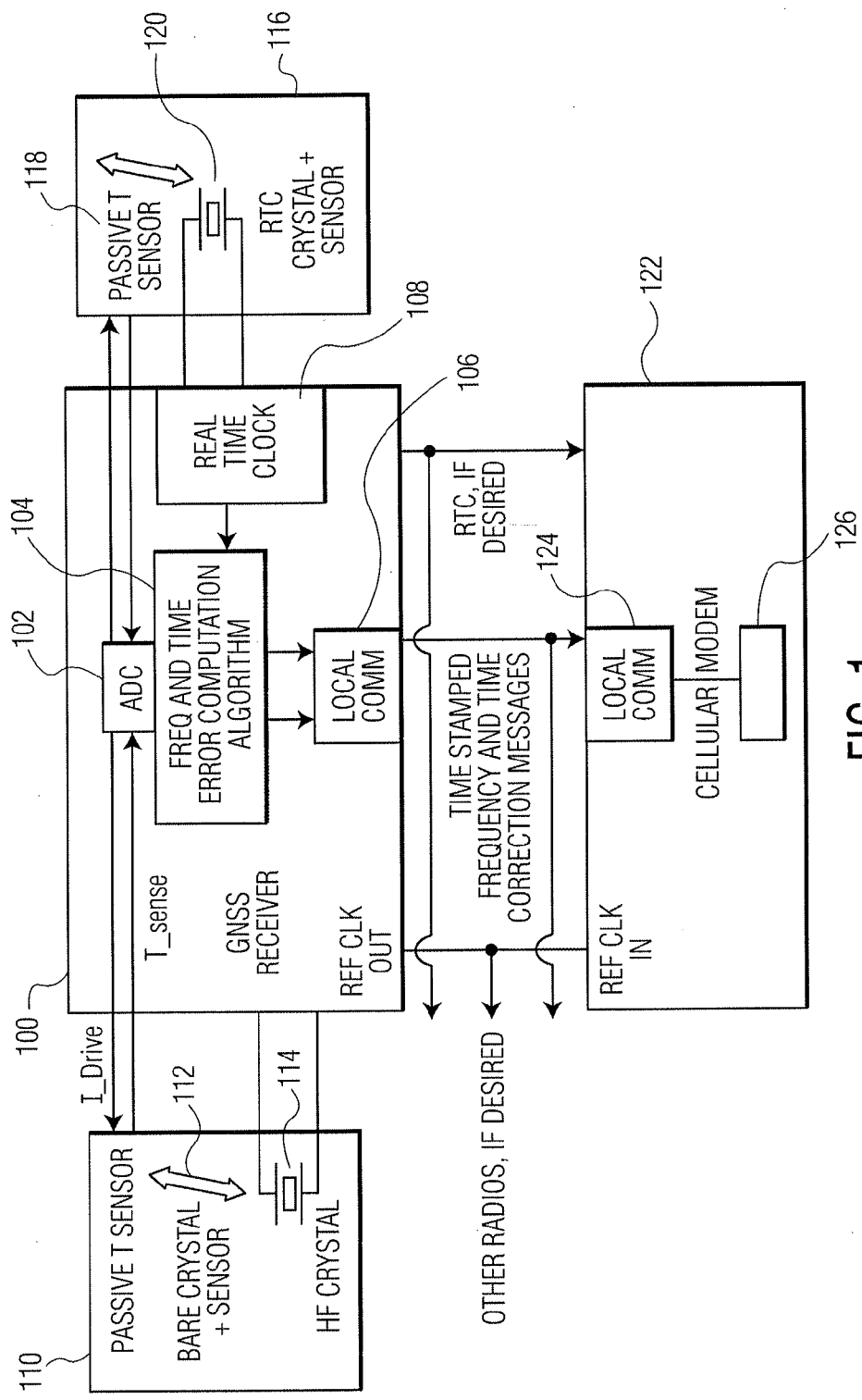
FIG. 1 is a block diagram of a reverse frequency and time aiding system that includes resonators and temperature sensors integrated into a common package, according to an embodiment of the present invention.

As will be described, the example embodiments provide a reverse frequency and time aiding system including a GNSS receiver and an RF receiver (e.g., a cellular modem) that share a common resonator. In one example, in a TSX device, the resonator may be a bare resonator (e.g. quartz crystal, silicon MEMs resonator, etc.) packaged with a temperature sensor. In another example, in a TSXO device, the resonator may be packaged with the temperature sensor and a temperature uncompensated oscillator circuit. In another example, in a TCXO device, the resonator may be packaged with the temperature sensor and a temperature compensated oscillator circuit. It is noted that temperature sensor may or may not be directly packaged with the resonator in the TSX, TSXO and TCXO devices, as long as the sensor and resonator are thermally coupled.

In one example, the reverse aiding system may include a GNSS receiver that is coupled to a cellular modem. The resonator is also shared by both the GNSS receiver and the cellular modem for providing a frequency signal used as a local oscillator for receiving satellite and cellular signals. The GNSS receiver may also be coupled to another lower frequency resonator that is used by a real time clock (RTC) for computing GNSS position and performing time stamping operations.

In general, the GNSS receiver computes frequency and/or time error correction data based on the frequencies of the respective resonators. This error correction data may be utilized in the GNSS receiver for correcting frequency and time to improve the GNSS signal acquisition and tracking. This information may also be transmitted to the cellular modem so that the cellular modem can perform a correction of frequency and time for receiving cellular signals.

In one example, the GNSS receiver includes a processor that performs the frequency and time error computations. The frequency and time error computations may be performed based on a resonator frequency model known to the GNSS receiver. In general, the frequency and time error correction data may be computed based on the measured temperature of the resonator and the frequency model which may be stored in memory on the GNSS receiver.

The frequency models of the high frequency resonator and/or the RTC resonator may be developed by the GNSS receiver and then periodically adjusted (resonator learning) by the GNSS receiver so that the GNSS receiver can more accurately predict the frequency of the resonator based on the operating temperature of the resonator. The resonator frequency model may initially be programmed into the GNSS receiver during manufacturing. The resonator frequency model may then be adjusted periodically (i.e. resonator learning is performed) based on a frequency error computed between the frequency of the resonator and received satellite signals at given operating temperatures.

An example frequency model may be implemented as a polynomial with P coefficients, where P is at least one. The polynomial represents the estimated operating frequency of the resonator with respect to the ambient temperature experienced by the resonator. The GNSS receiver may then use the computed frequency error (e.g. the error between the resonator frequency and the frequency computed based on the received satellite signals) to adjust the coefficients of the polynomial thereby reducing the frequency error for further frequency estimations. The details of the polynomial implementation described above are taught in U.S. Pat. No. 7,466,209, which is incorporated herein by reference.

It is noted that the high frequency resonator 114 and the RTC resonator 120 may both have a frequency model that performs resonator learning. These frequency models may then be utilized with the operating temperatures of the respective resonators to compute the frequency and time error correction data which is utilized by both the GNSS receiver and the cellular modem to correct frequency and time data.

Figure 2:
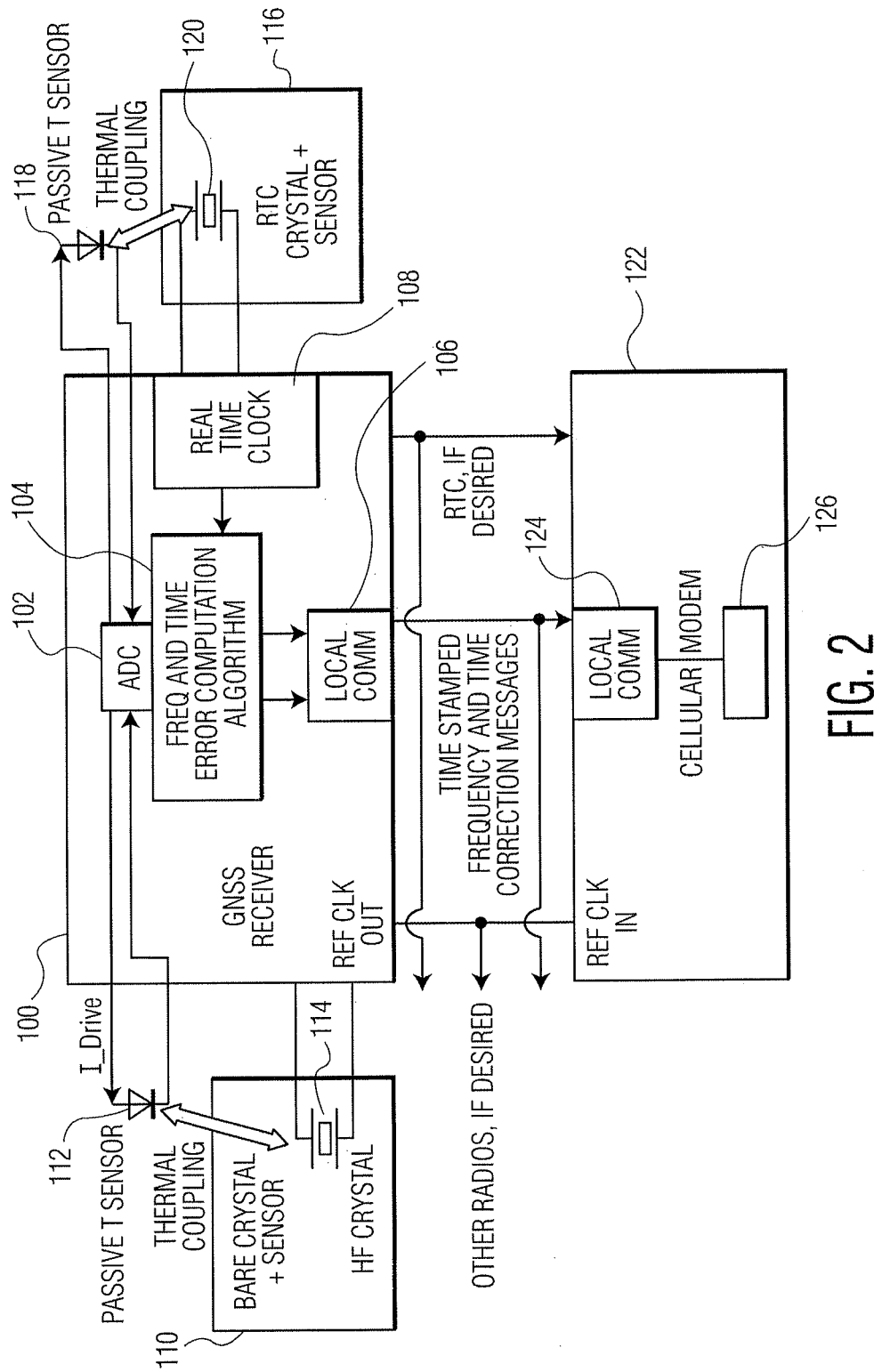
FIG. 2 is a block diagram, partly in schematic diagram form of a frequency and time aiding system where the temperature sensors are external to the resonators, according to an embodiment of the present invention.
Figure 3:
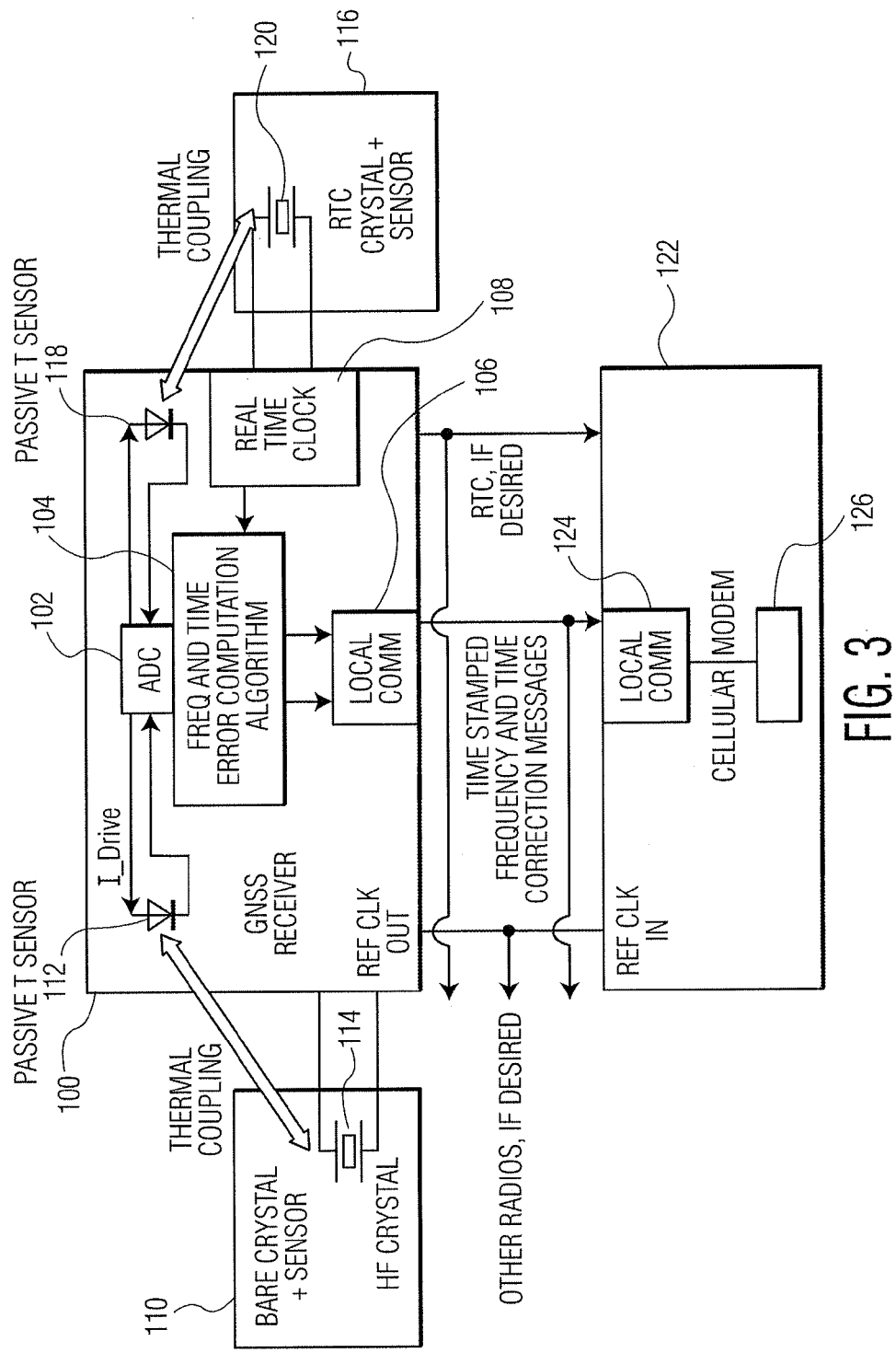
FIG. 3 is a block diagram, partly in schematic diagram form of a reverse frequency and time aiding system that includes the temperature sensors integrated into the GNSS receiver, according to an embodiment of the present invention.

Although FIGS. 1, 2 and 3 show that the GNSS receiver is coupled to and communicating with a single cellular modem, it is noted that a plurality of cellular modems or other RF receivers may also be coupled to the GNSS receiver. For example, the GNSS receiver may compute frequency and time error correction data for a plurality of RF receivers that may be inside the mobile device or in other mobile devices that share a common resonator.

Shown in FIG. 1 is an example of a reverse aiding system. The reverse aiding system may include GNSS receiver 100 that includes an analog to digital converter (ADC) 102 that converts an analog voltage from a temperature sensor into a digital value representative of resonator operating temperature, a processor 104 that computes frequency and time error correction data, a local communication port 106 that allows communication to other devices and a real time clock RTC 108 that computes a time value based on the frequency of the resonator and a counter (not shown).

The system may also include a crystal/sensor package 110 that includes a high frequency resonator 114 and temperature sensor 112. Also included is another crystal/sensor package 116 that includes a lower frequency resonator 120 and a temperature sensor 118. Furthermore, the system may also include an RF receiver such as cellular modem 122 that also includes a local communication port 124 for communicating with the GNSS receiver and a processor 126 for performing frequency and time error correction.

In the example shown in FIG. 1, packages 110 and 116 may be implemented as the TSX, TSXO and TCXO packages described above. Temperature sensors 112 and 118 may be implemented as silicon diodes for detecting the operating temperature of the resonators respectively. The analog voltage produced by the silicon diode due to the ambient temperature inside the package (i.e. the temperature experienced by the resonator) may be digitized by ADC 102 and then analyzed by processor 104. The ambient temperature inside the package may be due to the operation of electrical circuits (power amplifiers, etc.) within the mobile device. In general, processor 104 may have a chart/model mapping the silicon diode voltage to a specific resonator operating temperature which corresponds to a resonator operating frequency. In addition, other temperature sensors such as thermistors, proportional to absolute temperature devices (PTATs) or thermocouples may be used as the temperature sensors.

This configuration is just one example for simplifying and reducing costs of the system by utilizing a simple temperature sensor and a simple resonator. It is noted, however, that other packages such as TXOs and TCXOs may also be utilized in the various embodiments to approve accuracy.

In general, the uncompensated resonator frequency signal is input to both GNSS receiver 100 and cellular modem 122. The frequency and time correction data computed by the GNSS receiver is generally utilized by processors 104 and 126 to perform software correction to correctly receive the satellite and RF signals (i.e., GNSS receiver 100 and cellular modem 122 are able to utilize the frequency and time error correction data to compensate for the skewed frequency of the resonator with respect to its operating temperature). It is also noted that in another embodiment the actual frequency signal may be corrected in hardware.

In general, the resonator learning algorithm (i.e., the frequency model of the resonators) may be developed and loaded into the GNSS receiver during manufacturing. The GNSS receiver may also adjust the frequency models of the respective resonators in a number of ways.

In one example, the resonator learning takes places when GPS signals are being received by GNSS receiver 100. The satellite signals may be utilized to determine the frequency error of the high frequency resonator 114. This error may then be utilized to adjust the frequency model (i.e., perform resonator learning). This resonator learning may be performed for both the high frequency resonator and the real time clock resonator (i.e. both resonators may be adjusted based on the received satellite signals). It is noted that adjusting the models based on the satellite signals may be performed periodically to save power for example in SiRFaware™ which is a power mode for reducing power consumption of the GNSS receiver. Thus, the combination of resonator learning and the SiRFaware™ power mode allows the GNSS receiver to provide accurate frequency and time while only having to receive the GNSS signals sparingly (i.e., accurate frequency and time can be maintained without wasting power).

In another example, the frequency model of the RTC resonator may be adjusted (resonator learning for the RTC resonator may be performed) based on the frequency of the high frequency (more accurate) resonator 114 without receiving GPS signals.

For example, the GNSS receiver may compute a ratio between the frequency of a high frequency resonator 114 and the frequency of a lower frequency resonator 120. The GNSS receiver may then use the ratio and the corrected frequency of resonator 114 to estimate the corrected frequency of resonator 120.

In another example, the GNSS receiver may poll the cellular modem for help in measuring the resonator error with respect to the received cellular signals (i.e., bi-directional aiding). The frequency error between the corrected resonator frequency and the received cellular signal frequency may be computed and transmitted from the cellular modem back to the GNSS receiver. After the GNSS receiver achieves a position fix, the frequency models of the resonator may improve enough to where the direction of aiding may then again be reversed (i.e., the GNSS receiver may initially require help from the cellular modem until the frequency models have been sufficiently adjusted based on the resonator learning).

In general, the GNSS receiver may maintain the resonator models locally. The GNSS receiver may receive aiding information (frequency error information) from N receivers (i.e. N-way aiding), where N is at least one. This aiding information may be obtained from the N receivers that may have lower frequency error uncertainty than the existing resonator model. This aiding information may then be used by the GNSS receiver (forward aiding) to update the resonator model (i.e. perform learning). Once the model is properly adjusted, then aiding may once again be reversed. Switching between reverse and forward aiding may be performed in real time.

As described above, the frequency and time error correction data computed by processor 104 in the GNSS receiver may be transmitted to the cellular modem (or any other RF receiver that also utilizes the same resonator) via a local communication ports 106 and 124.

Cellular modem 122 also receives the uncompensated frequency signal of the high frequency resonator 114 and the RTC if desired. In general, processor 126 (which is configured to perform digital signal processing) utilizes the frequency and time error correction data, and the resonator signal to properly receive the cellular signals and correct the time (i.e., the corrections may be performed purely in software where the XOs hardware signal is not actually changed). Hardware frequency correction inside cell modem 122 can be performed alone, or in combination with software corrections.

This type of software based correction allows the GNSS receiver to transmit the frequency and time error correction data over the communications port to the cellular modem and other RF receivers without having to physically alter the resonator frequency. The cellular modem and/or other RF receivers may then be able to utilize the correction data to perform reception of the RF signals (i.e. the GNSS receiver determines the frequency and time error correction data, and the RF receivers independently perform the frequency and time correction).

In one example, the GNSS/RF receivers use the error correction data to correct the frequency of the resonator signal in hardware to receive the satellite/RF signals. In another example, the GNSS/RF receivers use the error correction data to perform pure DSP (i.e. software) frequency corrections to receive the satellite/RF signals. In yet another example, both hardware and software corrections may be performed.

It is noted that the RTC transmitted from the GNSS receiver to the cellular modem may be utilized by the cellular modem for time stamping the transmission and reception of cellular signals. For example, the corrected time data may be utilized to precisely time stamp the frequency and time correction data to ensure the proper application of the correction data. The corrected RTC may also be utilized to correctly time stamp financial transactions such as those being performed from a cellular phone to a server.

As shown in FIG. 2, the reverse aiding system may be configured such that the temperature sensors 112 and 118 are configured external to both the XO and the GNSS receiver (i.e., the sensors are not integrated with the XOs or the GNSS receiver). This configuration is possible as long as there is a thermal coupling between sensors 112 and 118 and resonators 114 and 120 respectively. It is noted that in another example, a single temperature sensor may be utilized. In general, a single sensor may be used when the resonators are physically close to each other such that the temperature of both resonators can assumed to be the similar.

In another example shown in FIG. 3, the temperature sensor may be integrated into the same package as the GNSS receiver. A single temperature sensor may be used in this example since the sensor is detecting the GNSS die temperature which is common to both resonators. In this example, the thermal coupling is between temperature sensors 112 and 118 inside the GNSS receiver and the external resonators 114 and 120 respectively.

It is noted that resonators 114 and 120 as described in the specification may or may not be packaged with oscillator circuits. It is also noted that the temperature sensor may be a silicon diode or some other passive or active temperature sensor. It is also noted that the processors 104 and 126 in the GNSS receiver and cellular modem 122 may be implemented by a microprocessor, application specific integrated circuit (ASIC) or a field programmable gate array (FPGA) that compute the frequency and time error correction data, perform resonator learning, and perform other standard GNSS and cellular operations.

In general, reverse time aiding as described above may benefit systems (e.g. mobile devices that include a GNSS receiver and at least one other RF receiver) by increasing frequency and time accuracy, thereby increasing performance of RF reception and timing based operations. Reverse time aiding may also benefit these systems by allowing the implementation of a cheaper and more basic temperature uncompensated resonator, thereby decreasing manufacturing costs.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A global navigation satellite system (GNSS) receiver, comprising:
a processor configured to:
   receive a temperature signal from a temperature sensor that indicates an operating temperature of a resonator,
   update a frequency model of the resonator based on a frequency error between a frequency of the resonator and a frequency determined from received satellite signals,
   compute a frequency and a frequency correction data of the resonator based on the temperature signal and the updated frequency model of the resonator,
   transmit the frequency correction data to a radio frequency (RF) receiver separate from the GNSS receiver, the RF receiver using the frequency correction data and the resonator to receive an RF signal different from the satellite signals,
   wherein the GNSS receiver uses the frequency correction data to receive satellite signals.

2. The GNSS receiver of claim 1,
wherein the RF receiver and GNSS receiver are configured in a mobile phone, the RF receiver being a cellular modem for receiving and processing cellular signals.

3. The GNSS receiver of claim 1,
wherein the processor is configured to transmit the frequency correction data to another RF receiver that uses the frequency correction data to receive another RF signal.

4. The GNSS receiver of claim 1,
wherein the processor is configured to:
   receive an other temperature signal from an other temperature sensor that indicates an other operating temperature of an other resonator,
   compute a time correction data based on the other temperature signal and an other frequency model of the other resonator,
   transmit the time correction data to the RF receiver, the RF receiver correcting a time value based on the time correction data, and time stamping reception and transmission of RF signals.

5. The GNSS receiver of claim 4,
wherein the processor is configured adjust the frequency model and the other frequency model based on frequency error computed between a frequency generated from satellite signals received by the GNSS receiver and the resonator frequency, and between the frequency generated from the satellite signals and the other resonator frequency, respectively.

6. The GNSS receiver of claim 4,
wherein the processor is configured adjust the other frequency model based on frequency error computed between the resonator frequency and the other resonator frequency.

7. A mobile communication device, comprising:
a global navigation satellite system (GNSS) receiver; and
a cellular receiver;
the GNSS receiver including a processor configured to:
   receive a temperature signal from a temperature sensor that indicates an operating temperature of a resonator,
   update a frequency model of the resonator based on a frequency error between a frequency of the resonator and a frequency determined from received satellite signals,
   compute a frequency and a frequency correction data of the frequency signal based on the temperature signal and the updated frequency model of the resonator, and
   transmit the frequency correction data to the cellular receiver,
the cellular receiver including a processor configured to:

receive the frequency correction data,
receive cellular signals using the frequency correction data and the resonator.

8. The mobile communication device of claim 7,
wherein, in bi-directional aiding, the processor in the cellular receiver is configured to:
compute other frequency correction data based on a frequency error between the resonator frequency and a frequency generated from the received cellular signal, and
transmit the other frequency correction data to the GNSS receiver,
wherein the processor in the GNSS receiver is configured to update the frequency model based on the other frequency correction data, and
wherein the processor is configured to update the frequency model based on the least uncertain of the frequency correction data and the other frequency correction data.

9. The mobile communication device of claim 7,
wherein the resonator includes a quartz crystal uncompensated for temperature, and the temperature sensor is a silicon diode.

10. The mobile communication device of claim 7,
wherein the processor is configured adjust the frequency model based on frequency error computed between a frequency generated based on the received satellite signals and the resonator frequency.

11. The mobile communication device of claim 7,
wherein the processor is configured to:
receive another frequency signal from another resonator,
receive an other temperature signal from an other temperature sensor that indicates an other operating temperature of the an other resonator,
compute time correction data of the other frequency signal based on the other temperature signal and the received satellite signal,
transmit the time correction data to the cellular receiver, the cellular receiver correcting a time value based on the time correction data, and time stamping reception and transmission of the cellular signals.

12. A method for providing reverse aiding from a global navigation satellite system (GNSS) receiver to a radio frequency (RF) receiver, the method comprising:
receiving, by the GNSS receiver, a temperature signal from a temperature sensor that indicates an operating temperature of a resonator,
updating a frequency model of the resonator based on a frequency error between a frequency of the resonator and a frequency determined from received satellite signals,
computing, by the GNSS receiver, a frequency and a frequency correction data of the frequency signal based on the temperature signal and the updated frequency model of the resonator,
transmitting, by the GNSS receiver, the frequency correction data to the RF receiver separate from the GNSS receiver,
receiving, by the RF receiver, the frequency correction data,
receiving, by the RF receiver, RF signals different from the satellite signals by using the frequency correction data and the resonator.

13. The method of claim 12, further including,
receiving, by the GNSS receiver, an other frequency signal from an other resonator,
receiving, by the GNSS receiver, an other temperature signal from an other temperature sensor that indicates an operating temperature of the an other resonator,
computing, by the GNSS receiver, time correction data of the frequency signal based on the other temperature signal and an other frequency model of the other resonator,
transmitting, by the GNSS receiver, the time correction data to the RF receiver,
receiving, by the RF receiver, the time correction data,
correcting, by the RF receiver, a time value based on the time correction data,
time stamping, by the RF receiver, the received and transmitted RF signals with the corrected time value.

14. The method of claim 12, further including,
developing, by the GNSS receiver, the frequency model based on initial model information stored in the GNSS receiver, and periodically adjusting the model based on frequency error between the resonator frequency and a frequency generated based on the received satellite signals at measured temperatures.

15. The method of claim 13, further including,
developing, by the GNSS receiver, the other frequency model based on initial model information stored in the GNSS receiver, and periodically adjusting the model based on frequency error between the resonator frequency and the other resonator frequency.

16. The method of claim 12, further including,
performing bi-directional aiding by:
computing, by the RF receiver, other frequency correction data based on a frequency error between the resonator frequency and a frequency generated from the received RF signals,
transmitting, by the RF receiver, to the GNSS receiver, the other frequency correction data, and
updating, by the GNSS receiver, the frequency model based on the other frequency correction data.

17. The method of claim 12, further including,
periodically adjusting the frequency model of the resonator when the GNSS receiver is receiving satellite signals.

18. The method of claim 12, wherein the RF receiver includes a cellular modem, the method further including
receiving, by the cellular modem, cellular signals, by performing a digital signal processing function on the cellular signals based on the frequency correction data.

19. The method of claim 12, further including,
periodically polling the GNSS receiver, by the RF receiver, to request transmission of updated frequency correction data.

* * * * *